United States Patent
Farazian et al.

(10) Patent No.: US 9,819,307 B2
(45) Date of Patent: Nov. 14, 2017

(54) LOW POWER CURRENT RE-USING TRANSFORMER-BASED DUAL-BAND VOLTAGE CONTROLLED OSCILLATOR

(71) Applicant: QUALCOMM Incorporated, San Diego, CA (US)

(72) Inventors: Mohammad Farazian, San Diego, CA (US); Masoud Moslehi Bajestan, San Diego, CA (US); Yiwu Tang, San Diego, CA (US); Jong Min Park, San Diego, CA (US); Sujiang Rong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/745,033

(22) Filed: Jun. 19, 2015

(65) Prior Publication Data

US 2016/0373057 A1     Dec. 22, 2016

(51) Int. Cl.
    *H03B 5/12*       (2006.01)
    *H03L 7/099*      (2006.01)

(52) U.S. Cl.
    CPC ........... *H03B 5/124* (2013.01); *H03B 5/1212* (2013.01); *H03B 5/1215* (2013.01);
                 (Continued)

(58) Field of Classification Search
    CPC ............................... H03B 5/124; H03B 27/00
                 (Continued)

(56) References Cited

U.S. PATENT DOCUMENTS 5,912,596 A *   6/1999   Ghoshal .............. H03K 3/0322
                                                           331/108 B
6,456,167 B1     9/2002   Huang
                               (Continued)

FOREIGN PATENT DOCUMENTS

| WO | 2009054760 A1 | 4/2009 |
|----|---------------|--------|
| WO | 2009104839 A1 | 8/2009 |
| WO | 2012054826 A1 | 4/2012 |

OTHER PUBLICATIONS

Borremans J., et al., "A Single-Inductor Dual-Band VCO in a 0.06mm2 5.6GHz Multi-Band Front-End in 90nm Digital CMOS", IEEE International Solid-State Circuits Conference ISSCC 2008, Digest of Technical Papers, Feb. 2008, IEEE, p. 324-616.
Guansheng L., et al., "A Low-Phase-Noise Wide-Tuning-Range Oscillator Based on Resonant Mode Switching", IEEE Journal of Solid-State Circuits, RFIC Virtual Journal, vol. 47, No. 6, Jun. 2012, pp. 1295-1308.

(Continued)

*Primary Examiner* — Jeffrey Shin
(74) *Attorney, Agent, or Firm* — Procopio, Cory, Hargreaves & Savitch LLP

(57) ABSTRACT

A dual-band voltage controlled oscillator (VCO) includes: a first oscillator circuit including a first inductor; a second oscillator circuit including a second inductor; a first mode switch configured to electrically connect or disconnect a first output terminal of the first oscillator circuit and a first output terminal of the second oscillator circuit; a second mode switch configured to electrically connect or disconnect a second output terminal of the first oscillator circuit and a second output terminal of the second oscillator circuit; a third mode switch configured to electrically connect or disconnect a first terminal of the first inductor and a first terminal of the second inductor; and a fourth mode switch configured to electrically connect or disconnect a second terminal of the first inductor and a second terminal of the second inductor.

23 Claims, 7 Drawing Sheets

(52) U.S. Cl.
CPC ......... *H03B 5/1256* (2013.01); *H03B 5/1296* (2013.01); *H03L 7/099* (2013.01); *H03B 2200/0072* (2013.01)

(58) Field of Classification Search
USPC .... 331/2, 46, 47, 50, 52, 56, 117 R, 117 FE, 331/167
See application file for complete search history.

(56) References Cited

U.S. PATENT DOCUMENTS

| | | | |
|---|---|---|---|
| 7,005,930 B1 * | 2/2006 | Kim | H03L 7/24 331/117 R |
| 8,125,282 B2 | 2/2012 | Bao et al. | |
| 8,212,625 B2 * | 7/2012 | Lee | H03B 5/1228 331/117 FE |
| 8,294,528 B2 | 10/2012 | Li et al. | |
| 2002/0109556 A1 * | 8/2002 | Leenaerts | H03K 3/0322 331/113 R |
| 2008/0007366 A1 | 1/2008 | Bevilacqua et al. | |
| 2009/0184774 A1 * | 7/2009 | Deng | H03B 5/1228 331/117 FE |
| 2010/0271086 A1 * | 10/2010 | Bao | H03B 5/1852 327/144 |
| 2014/0009236 A1 | 1/2014 | Choi et al. | |

OTHER PUBLICATIONS

Lee S.H., et al., "A Low Power Injection Locked LC-Tank Oscillator with Current Reused Topology," IEEE Microwave and Wireless Components Letters, Mar. 2007, vol. 17 (3), pp. 220-222.

Park K.G., et al., "Current Reusing VCO and Divide-by-Two Frequency Divider for Quadrature LO Generation," IEEE microwave and Wireless Components Letters, Jun. 2008, vol. 18 (6), pp. 413-415.

Safarian Z., et al., "Wideband Multi-Mode CMOS VCO Design Using Coupled Inductors", IEEE Transactions on Circuits and Systems I: Regular Papers, RFIC Virtual Journal, IEEE, vol. 56, No. 8, Aug. 2009, pp. 1830-1843.

Taghivand M., et al., "A 324-to-8.45 Ghz Low-Phase-Noise Mode-Switching Oscillator", 2014 IEEE International Solid-State Circuits Conference Digest of Technical Papers (ISSCC),Feb. 9-13, 2014, pp. 368-369.

International Search Report and Written Opinion—PCT/US2016/033620—ISA/EPO—dated Jul. 22, 2016.

Tam S W., et al., "A Dual Band mm-wave CMOS Oscillator with Left-handed Resonator", Radio Frequency Integrated Circuits Symposium, 2009. RFIC 2009. IEEE, IEEE, Piscataway, NJ, USA, Jun. 7, 2009 (Jun. 7, 2009), pp. 477-480, XP031480320, ISBN: 978-1-4244-3377-3 Section IV. Circuit Design.

* cited by examiner

LOW POWER CURRENT RE-USING TRANSFORMER-BASED DUAL-BAND VOLTAGE CONTROLLED OSCILLATOR

BACKGROUND

Field

The present disclosure relates generally to voltage controlled oscillators (VCO), and more particularly to a current re-using transformer-based dual-band VCO.

Background

Phase-locked loops (PLL) are widely used in many areas of electronics, including telecommunications as control systems. A PLL may include a VCO that generates a signal used by the PLL to match the phase of the oscillator with the phase of a received signal. The PLL may supply a voltage to the VCO to keep the phases of the received signal and the VCO signal matched. Many electronic devices, for example, mobile communication devices, operate over wide frequency ranges. However, efforts to widen the turning range of a single VCO leads to a degradation of phase noise or an increase in the power consumption.

Dual-band VCOs may employ two oscillator cores and operate in two frequency bands, for example in a range of about 2.4-4.0 GHz (low band) and a range of about 3.3-5.6 GHz (high band) and may operate in even mode (i.e., with the output signals of the two cores in-phase) or odd mode (i.e., with the output signals of the two cores out-of-phase). Conventional dual-band VCOs may have two VCO cores with re-channel metal-oxide semiconductor (NMOS) cross-coupled transistors. However, cross-coupled NMOS VCO architectures may require high operating currents. Further, conventional dual-band VCOs may become unstable, i.e., the VCO may oscillate at more than one frequency during high-band and/or low-band operation.

SUMMARY

Apparatuses and methods for implementing a current re-using transformer-based dual-band VCO are provided.

According to various embodiments there is provided a dual-band VCO. In some embodiments, the dual-band VCO may include: a first oscillator circuit including a first inductor; a second oscillator circuit including a second inductor; a first mode switch configured to electrically connect or disconnect a first output terminal of the first oscillator circuit and a first output terminal of the second oscillator circuit; a second mode switch configured to electrically connect or disconnect a second output terminal of the first oscillator circuit and a second output terminal of the second oscillator circuit; a third mode switch configured to electrically connect or disconnect a first terminal of the first inductor and a first terminal of the second inductor; and a fourth mode switch configured to electrically connect or disconnect a second terminal of the first inductor and a second terminal of the second inductor.

According to various embodiments there is provided a mobile communication device. In some embodiments, the mobile communication device may include: a phase-locked loop and a dual-band voltage controlled oscillator (VCO).

The dual-band VCO may include: a first oscillator circuit including a first inductor; a second oscillator circuit including a second inductor; a first mode switch configured to electrically connect or disconnect a first output terminal of the first oscillator circuit and a first output terminal of the second oscillator circuit; a second mode switch configured to electrically connect or disconnect a second output terminal of the first oscillator circuit and a second output terminal of the second oscillator circuit; a third mode switch configured to electrically connect or disconnect a first terminal of the first inductor and a first terminal of the second inductor; and a fourth mode switch configured to electrically connect or disconnect a second terminal of the first inductor and a second terminal of the second inductor.

Other features and advantages of the present disclosure should be apparent from the following description which illustrates by way of example aspects of the present disclosure.

BRIEF DESCRIPTION OF THE DRAWINGS

Aspects and features of the present disclosure will be more apparent by describing example embodiments with reference to the accompanying drawings, in which.

DETAILED DESCRIPTION

While certain embodiments are described, these embodiments are presented by way of example only, and are not intended to limit the scope of protection. The apparatuses, methods, and systems described herein may be embodied in a variety of other forms. Furthermore, various omissions, substitutions, and changes in the form of the example methods and systems described herein may be made without departing from the scope of protection.

Various embodiments provide a current-reusing architecture using one cross-coupled NMOS transistor pair and one cross-coupled PMOS transistor pair. Passive mode selection may be provided by four switches and may provide stable dual-band operation only at one of the resonant frequencies.

Figure 1A:
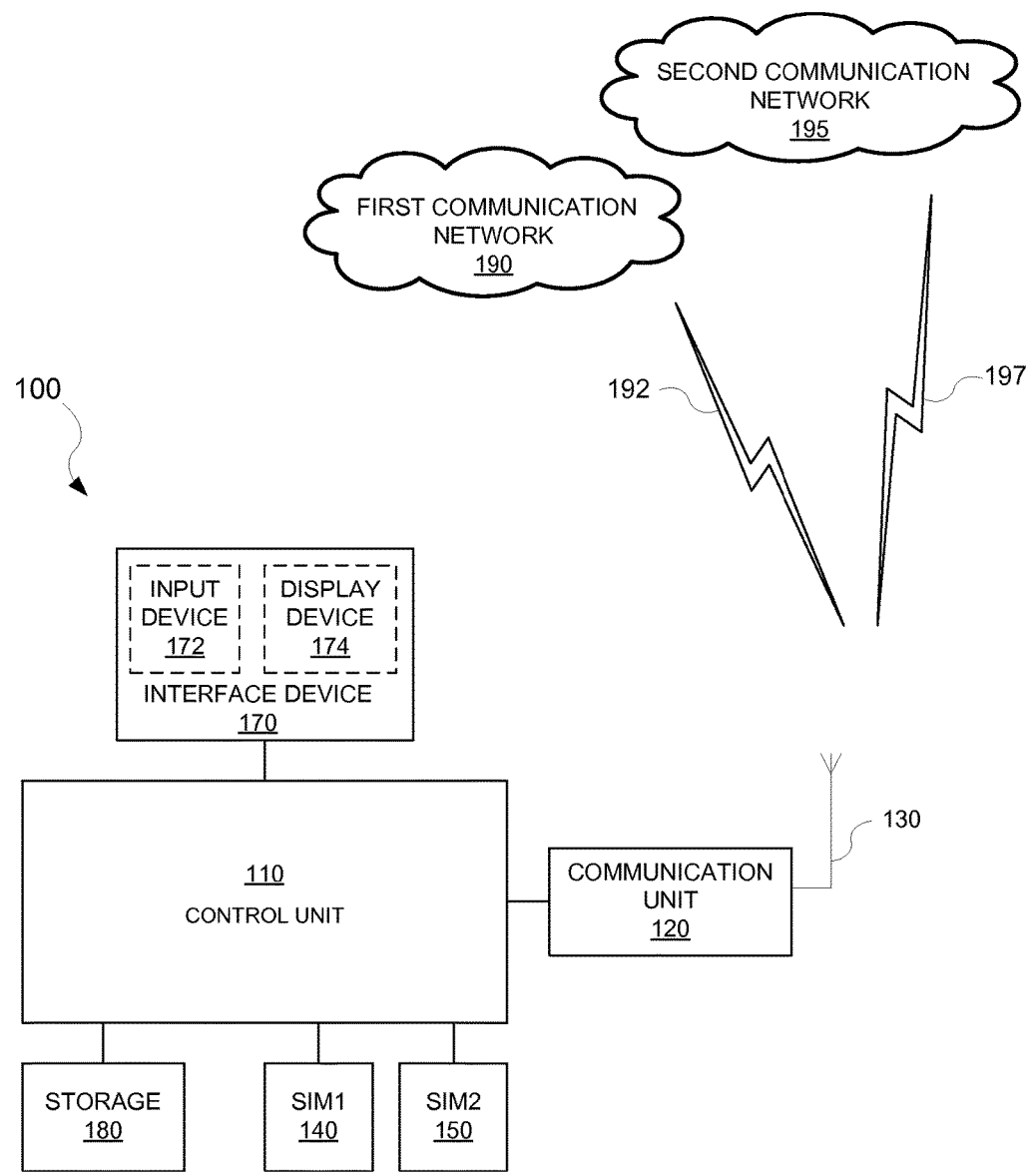
FIG. 1A is a block diagram illustrating a mobile communication device according to various embodiments.

FIG. 1A is a block diagram illustrating a mobile communication device 100 according to various embodiments. As illustrated in FIG. 1, the mobile communication device 100 may include a control unit 110, a communication unit 120, an antenna 130, a first subscriber identity module (SIM) 140, a second SIM 150, a user interface device 170, and a storage unit 180.

The mobile communication device 100 may be, for example but not limited to, a mobile telephone, smartphone, tablet, computer, etc., capable of communications with one or more wireless networks. One of ordinary skill in the art will appreciate that the mobile communication device 100 may include one or more transceivers (communications units) and may interface with one or more antennas without departing from the scope of the present disclosure.

Figure 1B:
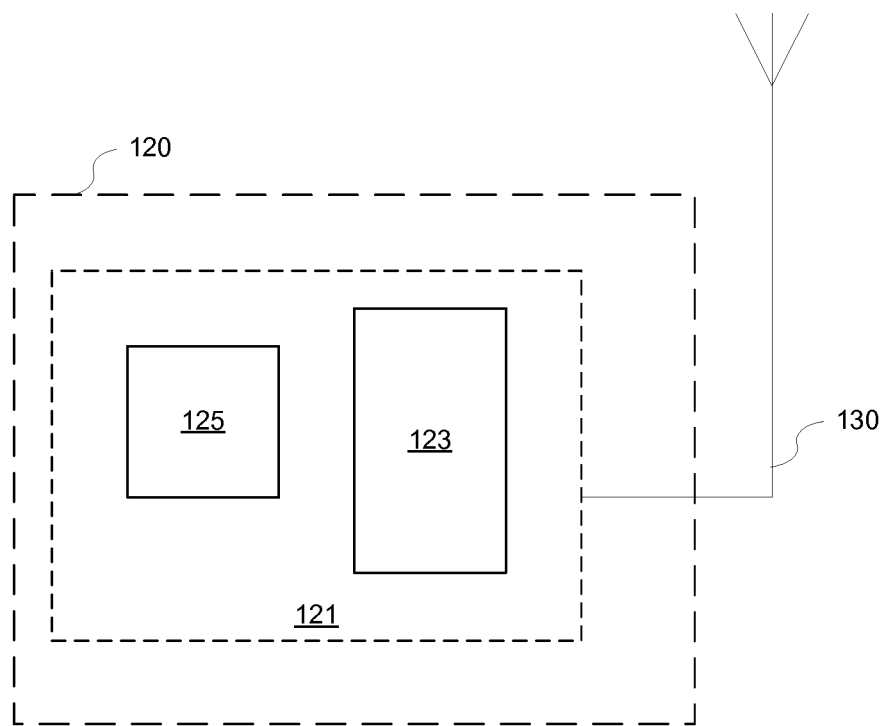
FIG. 1B is a block diagram illustrating a communication unit according to various embodiments.

FIG. 1B is a block diagram illustrating a communication unit 120 according to various embodiments. The communication unit 120 may include, for example, but not limited to, a transceiver 121. In active mode, a transceiver receives and transmits signals. In idle mode, a transceiver may receive but not transmit signals.

The transceiver 121 may include, for example, but not limited to, a PLL 123 and a dual-band VCO 125. The dual-band VCO 125 may generate a signal used by the PLL 123 to match the phase of the dual-band VCO 125 with the phase of a received signal. The PLL 123 may compare the phase of the signal generated by the dual-band VCO 125 with the phase of the received signal. The PLL 123 may supply a voltage to the dual-band VCO 125 to keep the phases of the received signal and the dual-band VCO 125 signal matched.

Referring again to FIG. 1A, a SIM (for example the first SIM 140 and/or the second SIM 150) in various embodiments may be a Universal Integrated Circuit Card (UICC) that is configured with SIM and/or universal SIM (USIM) applications, enabling access to global system for mobile communications (GSM) and/or Universal Mobile Telecommunications System (UMTS) networks. The UICC may also provide storage for a phone book and other applications. Alternatively, in a code division multiple access (CDMA) network, a SIM may be a UICC removable user identity module (R-UIM) or a CDMA subscriber identity module (CSIM) on a card. A SIM card may have a CPU, ROM, RAM, EEPROM and I/O circuits. An Integrated Circuit Card Identity (ICCID) SIM serial number may be printed on the SIM card for identification. However, a SIM may be implemented within a portion of memory of the mobile communication device 100, and thus need not be a separate or removable circuit, chip, or card.

A SIM used in various embodiments may store user account information, an IMSI, a set of SIM application toolkit (SAT) commands, and other network provisioning information, as well as provide storage space for phone book database of the user's contacts. As part of the network provisioning information, a SIM may store home identifiers (e.g., a System Identification Number (SID)/Network Identification Number (NID) pair, a Home PLMN (HPLMN) code, etc.) to indicate the SIM card network operator provider.

The first SIM 140 may associate the communication unit 120 with a first subscription (Sub1) 192 associated with a first radio access technology (RAT) on a first communication network 190 and the second SIM 150 may associate the communication unit 120 with a second subscription (Sub2) 197 associated with a second RAT on a second communication network 195. For convenience, throughout this disclosure Sub1 192 is associated with the first RAT 120 and Sub2 is associated with the second RAT 197. One of ordinary skill in the art will appreciate that either subscription may be associated with either RAT without departing from the scope of the present disclosure.

For convenience, the various embodiments are described in terms of dual-SIM dual-Standby (DSDS) mobile communication devices. However, one of ordinary skill in the art will appreciate that the present disclosure may be extended to Multi-SIM Multi-Standby (MSMS) mobile communication devices and/or multi-SIM multi-active mobile communication devices without departing from the scope of protection.

The first communication network 190 and the second communication network 195 may be operated by the same or different service providers, and/or may support the same or different RATs, for example, but not limited to, GSM, CDMA, WCDMA, LTE, etc.

The user interface device 170 may include an input device 172, for example, but not limited to a keyboard, touch panel, or other human interface device, and a display device 174, for example, but not limited to, a liquid crystal display (LCD), light emitting diode (LED) display, or other video display. One of ordinary skill in the art will appreciate that other input and display devices may be used without departing from the scope of the present disclosure.

The control unit 110 may be configured to control overall operation of the mobile communication device 100 including control of the communication unit 120, the user interface device 170, and the storage unit 180. The control unit 110 may be a programmable device, for example, but not limited to, a microprocessor (e.g., general-purpose processor, baseband modem processor, etc.) or microcontroller.

The storage unit 180 may be configured to store operating systems and/or application programs for operation of the mobile communication device 100 that are executed by the control unit 110, as well as to store application data and user data.

Figure 2A:
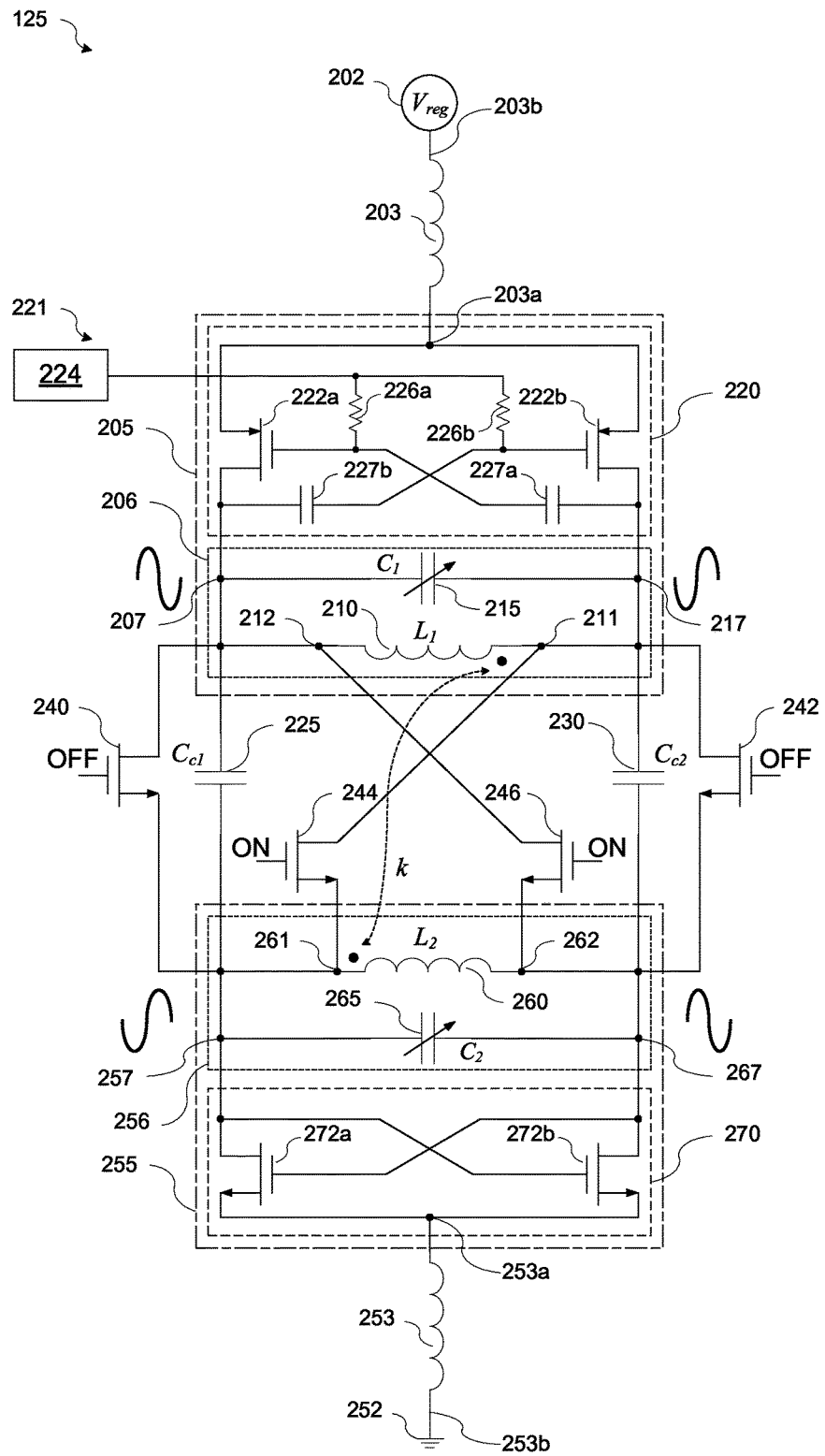
FIG. 2A is a circuit diagram of a dual-band VCO configured for low band operation according to various embodiments.

FIG. 2A is a circuit diagram illustrating a dual-band VCO 125 configured for low band operation according to various embodiments. Referring to FIG. 2A, the dual-band VCO 125 may include a first degeneration impedance 203, a first oscillator circuit 205 and a second oscillator circuit 255, and a second degeneration impedance 253.

The first oscillator circuit 205 may include a first tank circuit 206 and a first amplifier circuit 220. The first tank circuit 206 may include a first inductor 210 connected in parallel with a first variable capacitor 215 between a first output terminal 207 and a second output terminal 217 of the first oscillator circuit 205. The second oscillator circuit 255 may include a second tank circuit 256 and a second amplifier circuit 270. The second tank circuit 256 may include a second inductor 260 connected in parallel with a second variable capacitor 265 between a first output terminal 257 and a second output terminal 267 of the second oscillator circuit 255.

The first variable capacitor 215 and the second variable capacitor 265 may, for example, but not limited to, variable capacitance diodes, microelectromechanical (MEM) capacitors, or other electronically or digitally tuned capacitors or p-n junction devices. The first inductor 210 and the second inductor 260 may be magnetically coupled inductors, for example, but not limited to, a transformer or other magnetically coupled-inductor configuration. In various embodiments, the first inductor 210 and the second inductor 260 may have substantially same inductance values. In various embodiments, the first inductor 210 and the second inductor 260 may have a coupling coefficient, i.e., a coefficient of mutual inductance, k, less than or equal to about 0.2.

The first amplifier circuit 220 may include a first switch 222a and a second switch 222b. The first switch 222a and the second switch 222b may be configured as a cross-coupled pair of switches as known to those of ordinary skill in the art. The first switch 222a and the second switch 222b may be, for example, p-channel metal-oxide semiconductor (PMOS) transistors or other transistors capable of switching operation, MEM switches, etc. One of ordinary skill in the art will appreciate that each of the first switch 222a and the second switch 222b may be configured as more than one switch connected in parallel and/or in series. In some embodiments, for example, for dual-band VCO 125 operation with low power supply voltage, a gate bias circuit 221 including a bias power supply 224, a first bias resistor 226a, a first alternating current (AC) coupling capacitor 227a, a second bias resistor 226b, and a second AC coupling capacitor 227b, may provide a bias voltage for proper operation when the first switch 222a and the second switch 222b are PMOS transistors.

The first switch 222a may be electrically connected in series between a first terminal 203a of the first degeneration impedance 203 and the first output terminal 207 of the first oscillator circuit 205. The second switch 222b may be electrically connected in series between the first terminal 203a of the first degeneration impedance 203 and the second output terminal 217 of the first oscillator circuit 205. A second terminal 203b of the first degeneration impedance 203 may be electrically connected to a first power supply 202. The first amplifier circuit 220 may be configured to provide unity gain at an oscillation frequency of the first tank circuit 206.

The second oscillator circuit 255 may include a second tank circuit 256 and a second amplifier circuit 270. The second tank circuit 256 may include a second inductor 260 connected in parallel with a second variable capacitor 265. The second amplifier circuit 270 may include a third switch 272a and a fourth switch 272b. The third switch 272a and the fourth switch 272b may be configured as a cross-coupled pair of switches as known to those of ordinary skill in the art. The third switch 272a and the fourth switch 272b may be, for example, n-channel metal-oxide semiconductor (NMOS) transistors or other transistors capable of switching operation, MEM switches, etc. One of ordinary skill in the art will appreciate that each of the third switch 272a and the fourth switch 272b may be configured as more than one switch connected in parallel and/or in series.

The third switch 272a may be electrically connected in series between a first terminal 253a of the second degeneration impedance 253 and the first output terminal 257 of the second oscillator circuit 255. The fourth switch 272b may be electrically connected in series between the first terminal 253a of the second degeneration impedance 253 and the second output terminal 267 of the second oscillator circuit 255. A second terminal 253b of the second degeneration impedance 253 may be electrically connected to a second power supply 252. The second amplifier circuit 270 may be configured to provide unity gain at an oscillation frequency of the second tank circuit 256.

In some embodiments, the first amplifier circuit 220 may be configured without the gate bias circuit 221. FIG. 2C is a circuit diagram of a first amplifier circuit 220 for a dual-band VCO 125 configured without a gate bias circuit according to various embodiments.

When configured without the gate bias circuit 221, the first amplifier circuit 220 may include the first switch 222a and the second switch 222b. The first switch 2s2a and the second switch 222b may be configured as a cross-coupled pair of switches as known to those of ordinary skill in the art. The first switch 222a and the second switch 222b may be, for example, PMOS transistors or other transistors capable of switching operation, MEM switches, etc. One of ordinary skill in the art will appreciate that each of the first switch 222a and the second switch 222b may be configured as more than one switch connected in parallel and/or in series.

The complementary MOS (CMOS) switches (i.e., PMOS transistors in the first oscillator circuit 205 and NMOS transistors in the second oscillator circuit 255 may permit current re-use between the oscillator circuits thereby enabling low power operation. For example, in the CMOS configuration, the bias current of the PMOS cross-coupled transistors flows into NMOS cross-coupled transistors. Accordingly, the same bias current is "re-used" which may enable lower current consumption and lower power operation.

One of ordinary skill in the art will appreciate that other amplifier configurations, for example, but not limited to, operational amplifiers, special purpose amplifiers, etc., may be used for the first amplifier circuit 220 and the second amplifier circuit 270 may be used without departing from the scope of the present disclosure.

The first power supply 202 may provide a regulated voltage and the second power supply 252 may be a ground potential. One of ordinary skill in the art will appreciate that other power supply voltages may be provided without departing from the scope of the present disclosure.

A first coupling capacitor 225 may be electrically connected between a first output terminal 207 of the first oscillator circuit 205 and a first output terminal 257 of the second oscillator circuit 255. A second coupling capacitor 230 may be electrically connected between a second output terminal 217 of the first oscillator circuit 205 and a second output terminal 267 of the second oscillator circuit 255. The first coupling capacitor 225 and the second coupling capacitor 230 may electrically couple the first oscillator circuit 205 and the second oscillator circuit 255.

A first mode select switch 240 may be connected in parallel with the first coupling capacitor 225 electrically connect or disconnect the first output terminal of the first oscillator circuit and the first output terminal of the second oscillator circuit. A second mode select switch 242 may be connected in parallel with the second coupling capacitor 230 and may electrically connect or disconnect the second output terminal of the first oscillator circuit and the second output terminal of the second oscillator circuit.

A third mode select switch 244 may be configured to electrically connect or disconnect a first terminal 211 of the first inductor 210 and a first terminal 261 of the second inductor 260. A fourth mode select switch 246 may be configured to electrically connect or disconnect a second terminal 212 of the first inductor 210 and a second terminal 262 of the second inductor 260. The first through fourth mode select switches 240-246 may be, for example, but not limited to, NMOS transistors, PMOS transistors, or other transistors capable of switching operation, MEM switches, etc. One of ordinary skill in the art will appreciate that each of the first mode select switch 240, the second mode select switch 242, the third mode select switch 244 and the fourth mode select switch 246 may be configured as more than one switch connected in parallel and/or in series The first through fourth mode select switches 240-246 may permit the first inductor 210 and the second inductor 260 to be electrically connected such that the coupling coefficient causes an increase in total inductance in the first and second oscillator circuits 205, 255 (i.e., low band operation), or such that the coupling coefficient causes a decrease in total inductance in the first and second oscillator circuits 205, 255 (i.e., high band operation).

Referring to FIG. 2A, for low band operation, the first mode select switch 240 and the second mode select switch 242 may be in an open state, and the third mode select switch 244 and the fourth mode select switch 246 may be in a closed state. In the open state, the first mode select switch 240 and the second mode select switch 242 may cause the first coupling capacitor 225 and the second coupling capacitor 230, respectively, to couple the first oscillator circuit 205 and the second oscillator circuit 255 and causing total capacitance in the circuit to increase. In the closed state, the third mode select switch 244 may connect the first terminal 211 of the first inductor 210 to the first terminal 261 of the second inductor 260. In the closed state, the fourth mode select switch 246 may connect the second terminal 212 of the first inductor 210 to the second terminal 262 of the second inductor 260. In the closed state, third mode select switch 244 and the fourth mode select switch 246 may cause the first inductor 210 and the second inductor 260 to be electrically connected such that the mutual inductance increases the total inductance.

For low band operation, the frequency of oscillation, $f_{LB}$, is given by equation 1:

$$f_{LB} = \frac{1}{2\pi\sqrt{L(1+k)(C+C_c)}} \quad (1)$$

In equation 1, $L_1=L_2=L$, $C_1=C_2=C$, and $C_{c1}=C_{c2}=C_c$.

Figure 2B:
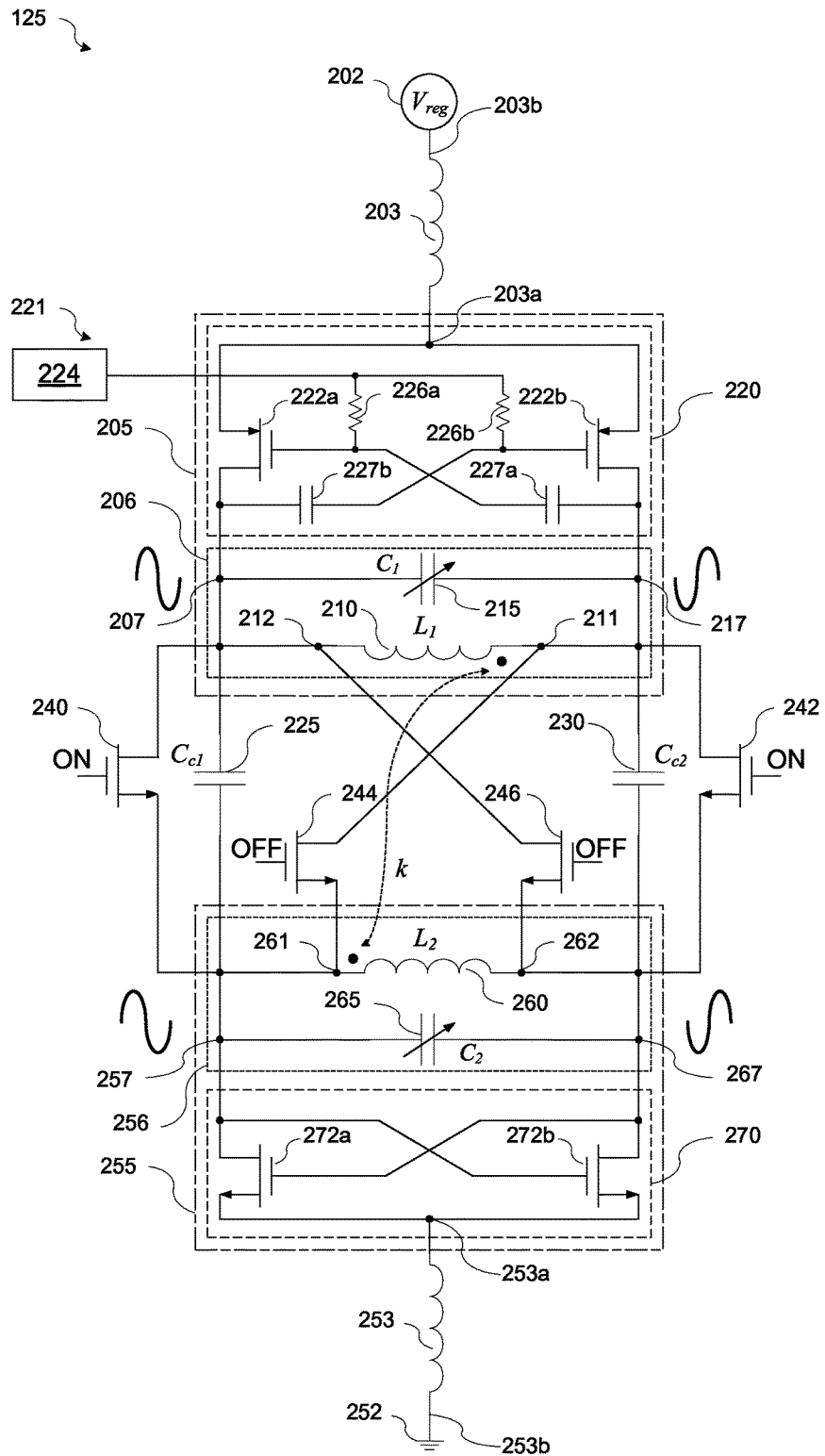
FIG. 2B is a circuit diagram of a dual-band VCO configured for high band operation according to various embodiments.
Figure 2C:
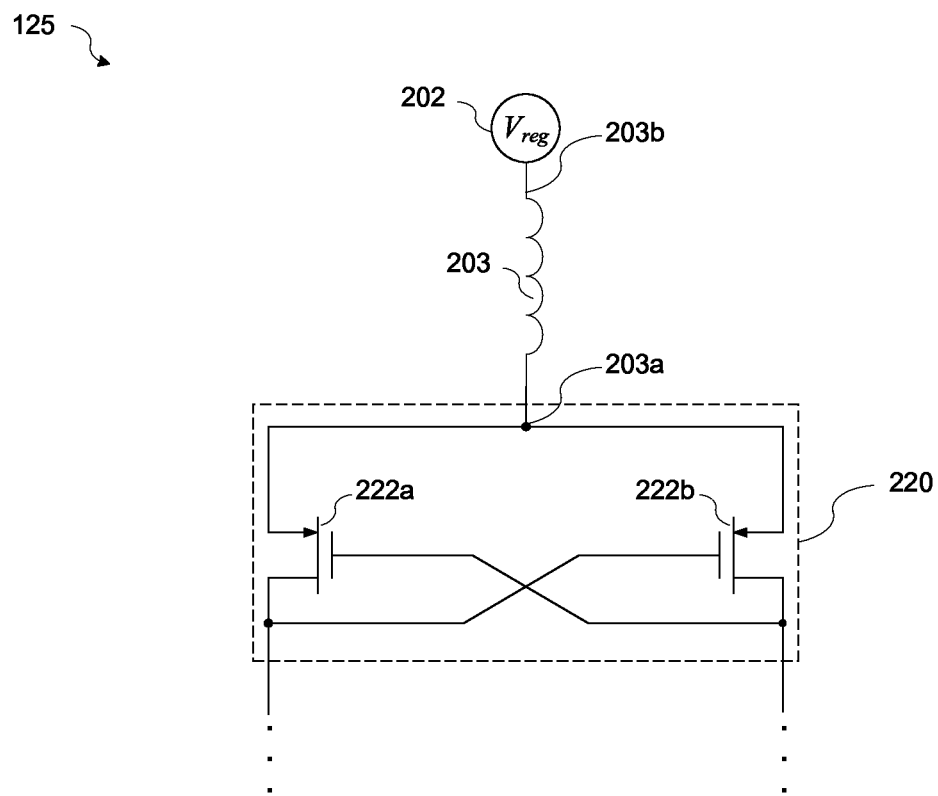
FIG. 2C is a circuit diagram of a first amplifier circuit for a dual-band VCO configured without a gate bias circuit according to various embodiments.

FIG. 2B is a circuit diagram illustrating the dual-band VCO 125 configured for high band operation according to various embodiments. The dual-band VCO 125 configuration of FIG. 2B is similar to the dual-band VCO 125 configuration of FIG. 2A with the exception of the operation of the first through fourth mode select switches 240-246.

Referring to FIG. 2B, for high band operation, the first mode select switch 240 and the second mode select switch 242 may be in a closed state, and the third mode select switch 244 and the fourth mode select switch 246 may be in an open state. In the closed state, the first mode select switch 240 may short-circuit the first coupling capacitor 225 thereby electrically connecting the second terminal 212 of the first inductor 210 and the first output terminal 207 of the first oscillator circuit 205 to the first terminal 261 of the second inductor 260 and the first output terminal 257 of the second oscillator circuit 255. In the closed state, the second mode select switch 242 may short-circuit the second coupling capacitor 230, thereby electrically connecting the first terminal 211 of the first inductor 210 and the second output terminal 217 of the first oscillator circuit 205 to the second terminal 262 of the second inductor 260 and the second output terminal 267 of the second oscillator circuit 255.

With the first mode select switch 240 and the second mode select switch 242 in the closed state, total capacitance in the circuit may decrease. With the first mode select switch 240 in the closed state and the third mode select switch 244 in the open state, the second terminal 212 of the first inductor 210 may be electrically connected to the first terminal 261 of the second inductor 260. With the second mode select switch 242 in the closed state and the fourth mode select switch 246 in the open state, the first terminal 211 of the first inductor 210 may be connected to the second terminal 262 of the second inductor 260. In the open state, third mode select switch 244 and the fourth mode select switch 246 may cause the first inductor 210 and the second inductor 260 to be connected such that the mutual inductance decreases the total inductance.

For high band operation, the frequency of oscillation, $f_{HB}$, is given by equation 2:

$$f_{HB} = \frac{1}{2\pi\sqrt{L(1-k)C}} \quad (2)$$

In equation 2, $L_1=L_2=L$ and $C_1=C_2=C$.

Both the coupling coefficient k and the coupling capacitor $C_c$ (i.e., the first coupling capacitor 225 and the second coupling capacitor 230) operate to separate the resonance frequencies for low band operation and high band operation.

Figure 3A:
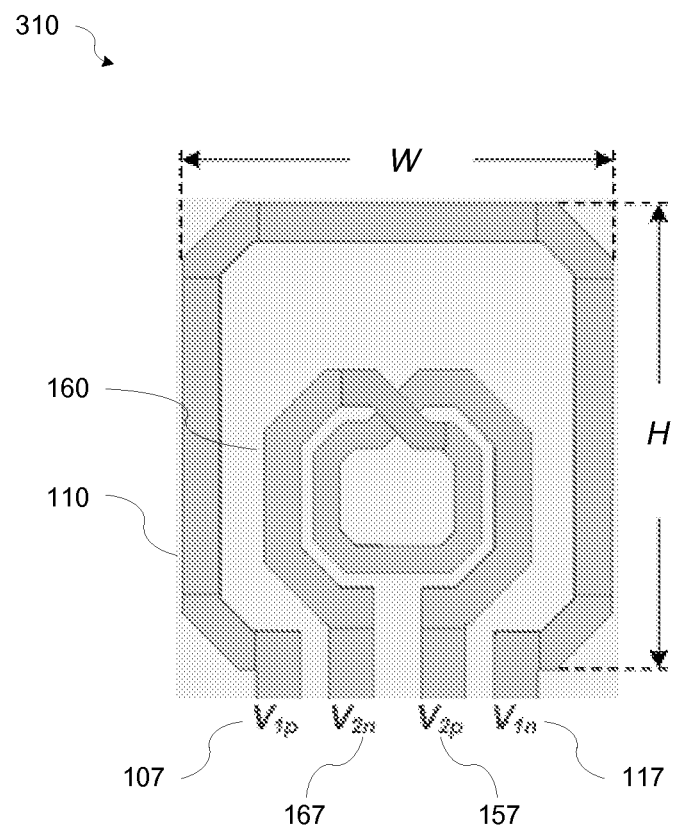
FIG. 3A is a diagram illustrating a transformer configuration according to various embodiments.

FIG. 3A is a diagram illustrating of a transformer configuration 310 according to various embodiments. Referring to FIGS. 2A-3A, the first inductor 210 and the second inductor 260 may be configured as planar inductors and may be fabricated using semiconductor fabrication techniques known to those of skill in the art. In some embodiments, the first inductor 210 may be arranged in proximity to the second inductor 260 such that the first inductor 210 and the second inductor 260 may be magnetically coupled. For example, the second inductor 260 may be disposed within an area described by the first inductor 210 and may be configured as a first transformer 310.

Figures 3B, 3C:
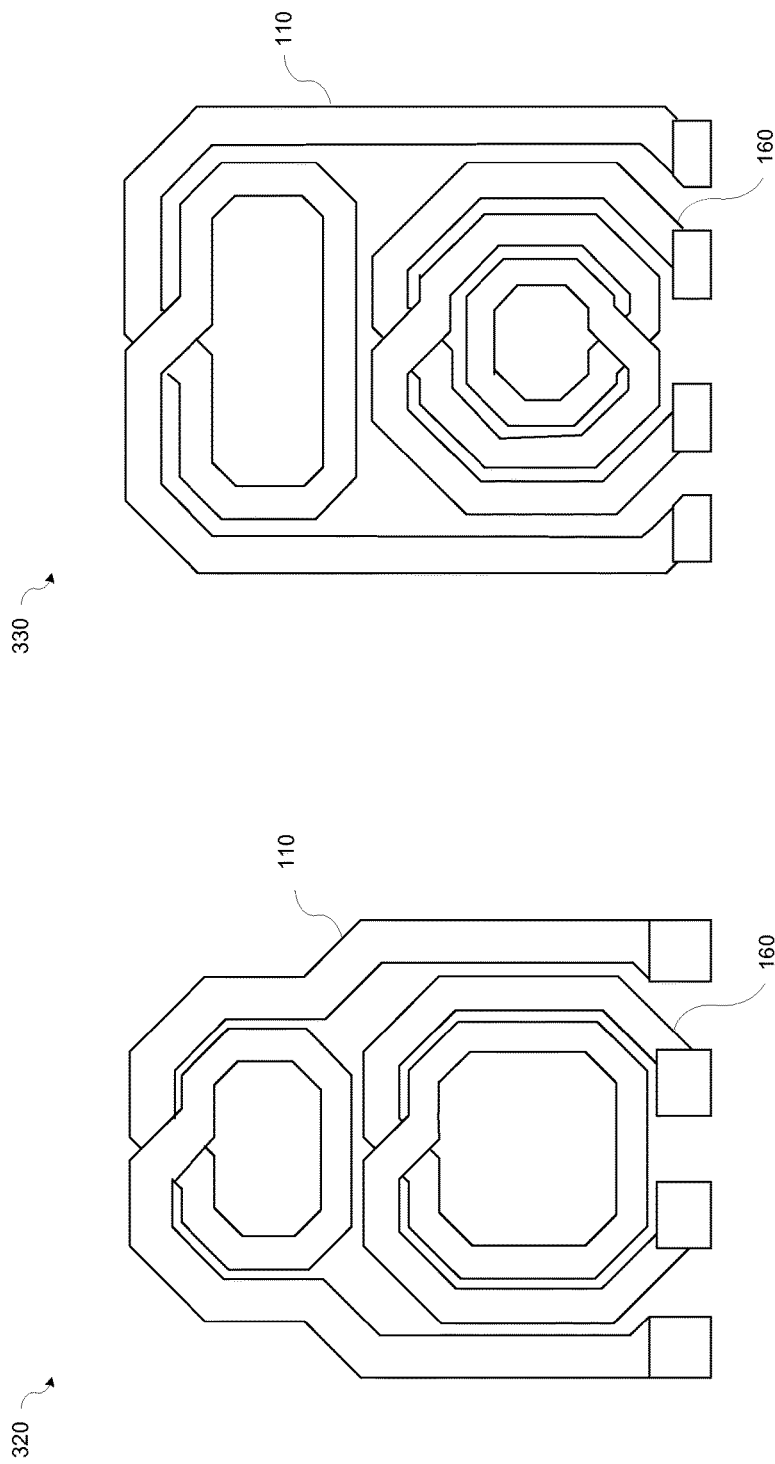
FIG. 3B is a diagram illustrating a transformer configuration according to various embodiments.
FIG. 3C is a diagram illustrating a transformer configuration according to various embodiments.

FIGS. 3B and 3C are diagrams illustrating alternate transformer configurations 320, 330 according to various embodiments. The second transformer configuration 320 and the third transformer configuration 330 may provide higher inductance values than the first transformer configuration 310 while maintaining approximately a same area as the transformer configuration 310 of FIG. 3A. For example, in various embodiments, the first inductor 210 and the second inductor 260 may occupy an area having a width, W, of approximately 300 μm and a height, H, of approximately 320 μm. One of ordinary skill in the art will appreciate that the dimensions are approximate and that other dimensions may be possible without departing from the scope of the present disclosure. The planar transformer configuration of the first inductor 210 and the second inductor 260 may enable implementation of the dual-band VCO 125 in a smaller area than conventional VCOs.

Although several embodiments of the present disclosure are described above, many variations of the present disclosure are possible. For example, although the illustrated embodiments described above configure the voltage controlled oscillator with transistors and capacitors, other elements such as buffers, operational amplifiers, and switches can be used to configure the voltage controlled oscillator. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the present disclosure. In addition, the grouping of functions within a module, block, or operation is for ease of description. Specific functions or operations can be moved from one module or block without departing from the present disclosure.

The various illustrative logical blocks, units, operations, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the various aspects described in the present disclosure. Various modifications to these embodiments will be readily apparent to those skilled in the art, and the generic principles described herein can be applied to other embodiments without departing from the spirit or scope of the present disclosure. Thus, it is to be understood that the description and drawings presented herein represent presently preferred embodiments of the present disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A dual-band voltage controlled oscillator (VCO), comprising:
    a first oscillator circuit comprising:
        a first inductor; and
        a cross-coupled pair of p-channel metal-oxide semiconductor (PMOS) transistors coupled to the first inductor;
    a second oscillator circuit comprising:
        a second inductor; and
        a cross-coupled pair of n-channel metal-oxide semiconductor (NMOS) transistors coupled to the second inductor;
    a first mode switch configured to electrically connect or disconnect a first output terminal of the first oscillator circuit to a first output terminal of the second oscillator circuit;
    a second mode switch configured to electrically connect or disconnect a second output terminal of the first oscillator circuit to a second output terminal of the second oscillator circuit;
    a third mode switch configured to electrically connect or disconnect a first terminal of the first inductor to a first terminal of the second inductor;
    a fourth mode switch configured to electrically connect or disconnect a second terminal of the first inductor to a second terminal of the second inductor;
    a first coupling capacitor configured to electrically couple the first output terminal of the first oscillator circuit to the first output terminal of the second oscillator circuit; and
    a second coupling capacitor configured to electrically couple the second output terminal of the first oscillator circuit to the second output terminal of the second oscillator circuit,
    wherein the first inductor and the second inductor are configured as a transformer having a coupling coefficient,
    wherein the first and second coupling capacitors and the transformer are configured to provide substantially similar power consumption in high band operation and low band operation, and
    wherein bias current for the cross-coupled pair of PMOS transistors is reused by the cross-coupled pair of NMOS transistors.

2. The dual-band VCO of claim 1, wherein the dual-band VCO operates in a low band configuration with the first mode switch and the second mode switch in an open state and the third mode switch and the fourth mode switch in a closed state.

3. The dual-band VCO of claim 2, wherein in the open state the first mode switch disconnects the first output terminal of the first oscillator circuit from the first output terminal of the second oscillator circuit and causes the first coupling capacitor to electrically couple the first output terminal of the first oscillator circuit to the first output terminal of the second oscillator circuit; and
    wherein in the open state the second mode switch disconnects the second output terminal of the first oscillator circuit from the second output terminal of the second oscillator circuit and causes the second coupling capacitor to electrically couple the second output terminal of the first oscillator circuit to the second output terminal of the second oscillator circuit.

4. The dual-band VCO of claim 2, wherein in the closed state the third mode switch connects the first terminal of the first inductor to the first terminal of the second inductor;
    wherein in the closed state the fourth mode switch connects the second terminal of the first inductor to the second terminal of the second inductor.

5. The dual-band VCO of claim 1, wherein the dual-band VCO operates in a high band configuration with the first mode switch and the second mode switch in a closed state and the third mode switch and the fourth mode switch in an open state.

6. The dual-band VCO of claim 5, wherein in the closed state the first mode switch short-circuits the first coupling capacitor and electrically couples the first output terminal of the first oscillator circuit to the first output terminal of the second oscillator circuit; and
    wherein in the closed state the second mode switch short-circuits the second coupling capacitor and electrically couples the second output terminal of the first oscillator circuit to the second output terminal of the second oscillator circuit.

7. The dual-band VCO of claim 5, wherein in the open state the third mode switch causes an electrical connection between the second terminal of the first inductor and the first terminal of the second inductor;
    wherein in the open state the fourth mode switch causes an electrical connection between the first terminal of the first inductor and the second terminal of the second inductor.

8. The dual-band VCO of claim 1, wherein the transformer comprises a planar transformer having the second inductor disposed within an area described by the first inductor.

9. The dual-band VCO of claim 1, wherein the first inductor and the second inductor have a same inductance value.

10. The dual-band VCO of claim 1, wherein the transformer has a coupling coefficient of about 0.2 between the first inductor and the second inductor.

11. The dual-band VCO of claim 1, wherein the first mode switch, the second mode switch, the third mode switch, and the fourth mode switch are selected from a group consisting of n-channel metal-oxide semiconductor (NMOS) transistors, p-channel metal-oxide semiconductor (PMOS) transistors, and microelectromechanical switches.

12. The dual-band VCO of claim 1, further comprising:
a first degeneration impedance configured to couple the first amplifier circuit to a first power supply; and
a second degeneration impedance configured to couple the second amplifier circuit to a second power supply.

13. A mobile communication device, comprising:
a phase-locked loop (PLL); and
a dual-band voltage controlled oscillator (VCO) configured to generate an output signal to the PLL, the dual-band VCO comprising:
a first oscillator circuit comprising:
a first inductor; and
a cross-coupled pair of p-channel metal-oxide semiconductor (PMOS) transistors coupled to the first inductor;
a second oscillator circuit comprising;
a second inductor; and
a cross-coupled pair of n-channel metal-oxide semiconductor (NMOS) transistors coupled to the second inductor;
a first mode switch configured to electrically connect or disconnect a first output terminal of the first oscillator circuit to a first output terminal of the second oscillator circuit;
a second mode switch configured to electrically connect or disconnect a second output terminal of the first oscillator circuit to a second output terminal of the second oscillator circuit;
a third mode switch configured to electrically connect or disconnect a first terminal of the first inductor to a first terminal of the second inductor;
a fourth mode switch configured to electrically connect or disconnect a second terminal of the first inductor to a second terminal of the second inductor;
a first coupling capacitor configured to electrically couple the first output terminal of the first oscillator circuit to the first output terminal of the second oscillator circuit; and
a second coupling capacitor configured to electrically couple the second output terminal of the first oscillator circuit to the second output terminal of the second oscillator circuit,
wherein the first inductor and the second inductor are configured as a transformer having a coupling coefficient,
wherein the first and second coupling capacitors and the transformer are configured to provide substantially similar power consumption in high band operation and low band operation, and
wherein bias current for the cross-coupled pair of PMOS transistors is reused by the cross-coupled pair of NMOS transistors.

14. The mobile communication device of claim 13, wherein the dual-band VCO operates in a low band configuration with the first mode switch and the second mode switch in an open state and the third mode switch and the fourth mode switch in a closed state.

15. The mobile communication device of claim 14, wherein in the open state the first mode switch disconnects the first output terminal of the first oscillator circuit from the first output terminal of the second oscillator circuit and causes the first coupling capacitor to electrically couple the first output terminal of the first oscillator circuit to the first output terminal of the second oscillator circuit; and
wherein in the open state the second mode switch disconnects the second output terminal of the first oscillator circuit from the second output terminal of the second oscillator circuit and causes the second coupling capacitor to electrically couple the second output terminal of the first oscillator circuit to the second output terminal of the second oscillator circuit.

16. The mobile communication device of claim 14, wherein in the closed state the third mode switch connects the first terminal of the first inductor to the first terminal of the second inductor;
wherein in the closed state the fourth mode switch connects the second terminal of the first inductor to the second terminal of the second inductor.

17. The mobile communication device of claim 13, wherein the dual-band VCO operates in a high band configuration with the first mode switch and the second mode switch in a closed state and the third mode switch and the fourth mode switch in an open state.

18. The mobile communication device of claim 17, wherein in the closed state the first mode switch short-circuits the first coupling capacitor and electrically couples the first output terminal of the first oscillator circuit to the first output terminal of the second oscillator circuit; and
wherein in the closed state the second mode switch short-circuits the second coupling capacitor and electrically couples the second output terminal of the first oscillator circuit to the second output terminal of the second oscillator circuit.

19. The mobile communication device of claim 17, wherein in the open state the third mode switch causes an electrical connection between the second terminal of the first inductor and the first terminal of the second inductor;
wherein in the open state the fourth mode switch causes an electrical connection between the first terminal of the first inductor and the second terminal of the second inductor.

20. The mobile communication device of claim 13, wherein the transformer is a planar transformer having the second inductor disposed within an area described by the first inductor.

21. The mobile communication device of claim 13, wherein the first inductor and the second inductor have a same inductance value.

22. The mobile communication device of claim 13, wherein the first mode switch, the second mode switch, the third mode switch, and the fourth mode switch are selected from a group consisting of n-channel metal-oxide semiconductor (NMOS) transistors, p-channel metal-oxide semiconductor (PMOS) transistors, and microelectromechanical switches.

23. The mobile communication device of claim 13, wherein the dual-band VCO further comprises:
a first degeneration impedance configured to couple the first amplifier circuit to a first power supply; and
a second degeneration impedance configured to couple the second amplifier circuit to a second power supply.

* * * * *